United States Patent [19]
Fan

[11] Patent Number: 5,006,364
[45] Date of Patent: Apr. 9, 1991

[54] SOLID IMAGING METHOD UTILIZING COMPOSITIONS COMPRISING THERMALLY COALESCIBLE MATERIALS

[75] Inventor: Roxy N. Fan, East Brunswick, N.J.

[73] Assignee: E. I. Du Pont de Nemours and Company, Wilmington, Del.

[21] Appl. No.: 398,194

[22] Filed: Aug. 24, 1989

[51] Int. Cl.$^5$ .............................................. B05D 3/06
[52] U.S. Cl. ........................................ 427/44; 427/36; 427/53.1; 427/54.1; 427/55; 427/264; 427/265; 427/375; 427/385.5; 427/407.1
[58] Field of Search ................ 427/44, 53.1, 264, 265, 427/375, 54.1, 385.5, 407.1, 55

[56] References Cited

U.S. PATENT DOCUMENTS

| | | | |
|---|---|---|---|
| 3,615,448 | 10/1971 | Yeshin | 96/33 |
| 4,125,700 | 11/1978 | Graham | 204/159.16 |
| 4,176,028 | 11/1979 | Graham | 204/159.16 |
| 4,251,618 | 2/1981 | McCartin et al. | 430/270 |
| 4,276,366 | 6/1981 | McCartin et al. | 430/291 |
| 4,309,331 | 1/1982 | Graham | 260/30.6 |
| 4,421,619 | 12/1983 | Graham | 204/159.16 |
| 4,465,572 | 8/1984 | Graham | 204/159.16 |
| 4,523,983 | 6/1985 | Lin | 204/159.15 |
| 4,568,405 | 2/1986 | Lin | 156/307.3 |
| 4,575,330 | 3/1986 | Hull | 425/174.4 |
| 4,623,558 | 11/1986 | Lin | 427/44 |
| 4,634,562 | 1/1987 | Downey | 264/22 |
| 4,752,498 | 6/1988 | Fudim | 427/54.1 |

FOREIGN PATENT DOCUMENTS 865180 9/1978 Belgium .
250121 2/1987 European Pat. Off. .

OTHER PUBLICATIONS

Kodama, Hideo; Rev. Sci, Instrum. 52(11), 1770–1773, Nov. 1981.
Herbert, Alan J.; Journal of Applied Photographic Engineering, 8(4), 185–188, Aug. 1982.

Primary Examiner—Bernard Pianalto

[57] ABSTRACT

A solid imaging method utilizing photoformable compositions comprising thermally coalescible materials for producing multilayer models and prototypes having improved structural properties and resolution.

18 Claims, 3 Drawing Sheets

SOLID IMAGING METHOD UTILIZING COMPOSITIONS COMPRISING THERMALLY COALESCIBLE MATERIALS

FIELD OF THE INVENTION

This invention relates to fabrication of three-dimensional objects by contiguous layers of a photoformable liquid, the liquid comprising thermally coalescible materials.

BACKGROUND OF THE INVENTION

Three dimensional imaging has recently become of great importance. The problems encountered in three dimensional imaging are considerably more severe and complex than those presented in two dimensional imaging, due to the additional necessity to accurately control the exposed depth, and to the multilayered structure involved in the former case, since in most cases at least a portion of the underlying layer remains photoactive during the period that the overlying layers are being exposed to a different pattern, and vice versa.

Many systems for production of three-dimensional modeling by photoforming have been proposed. European patent application (Publication No. 250,121 filed by Scitex Corporation, Ltd. on June 6, 1987), and incorporated herein by reference, provides a good summary of documents pertinent to this art area, including various approaches attributed to Hull, Kodama, and Herbert. Additional background is described in U.S. Pat. No. 4,752,498 issued to Fudim on June 21, 1988, which is also incorporated herein by reference.

These approaches relate to the formation of solid sectors of three-dimensional objects in steps by sequential irradiation of areas or volumes sought to be solidified. Various masking techniques are described as well as the use of direct laser writing, i.e., exposing a photoformable composition with a laser beam according to a desired pattern and building a three-dimensional model layer by layer.

One way of scanning is vector scanning, where only the areas corresponding to the shape of the rigid object have to be scanned, the amount of data to be stored is smaller, the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient radiation sources, such as lasers. Since these systems are electromechanical in nature, there is a finite acceleration involved in reaching any beam velocity. This unavoidable non-uniformity in velocity results in unacceptable thickness variations in the exposed photoformable composition. Especially in the case of portions of layers having no immediate previous levels of exposure at the high intensity it becomes necessary to use high beam velocities, and therefore, longer acceleration times, which in turn result in thickness non-uniformity in the exposed composition.

Little attention has been paid so far to the composition itself by related art in the field of solid imaging, except in very general terms.

Thus, the compositions usually employed, present a number of different problems, major ones of which are shrinkage, warpage, brittleness, low overall cohesive strength, and most importantly overgrowth (i.e., layer hardening depthwise) of infraposed surfaces which are not immediately over solid substrate and adhesion between contiguous layers. Infraposed surface of a photoformed layer is the surface opposite to the directly exposed surface by the actinic radiation, and on the side of the liquid. Thus, it is difficult, if not impossible, to obtain both accurate image resolution in both width and depth and good adhesion between layers.

It is an object of this invention to resolve the above problems by using photoformable compositions comprising thermally coalescible materials, as explained in the detailed description cited below.

A major class of coalescible materials named plastisols are described in "Plastisols and Organosols", Edited by H. A. Sarvetnick, Published by Van Nostrand Reinhold Company, 1972.

Art relevant to photopolymerizable plastisol compositions and known to the applicant is cited below. Part of this art deals with polyvinyl chloride plastisols, part with acrylic and methacrylic plastisols, and part with different other classes of plastisols. None of this art, however, recognizes or deals with the problem of overgrowth of infraposed surfaces in partially photoformed multilayer structures, in which the unphotoformed materials have bee removed before thermal coalescence, or with the problem of adhesion between contiguous layers.

U.S. Pat. No. 4,634,562 describes a shapeable and photogellable liquid or fluid polyvinyl chloride composition comprising a blend of polyvinyl chloride with sufficient plasticizer and about 13 to 50 parts per hundred of a photopolymerizable polymer to give a liquid or fluid composition. Preferably said composition may contain a photoinitiator and a polyvinyl chloride stabilizer.

U.S. Pat. No. 4,623,558 describes an invention relating to a thermosetting plastisol dispersion composition comprising (1) poly(phenylene oxide) (PPO) in powder form, which is insoluble in the reactive plasticizer at room temperature and plasticizable at a temperature at or above the fluxing temperature; (2) a liquid reactive plasticizer member of the group consisting of (a) at least one epoxide resin having an average of more than one epoxide group in the molecule, (b) at least one liquid monomer, oligomer or prepolymer containing at least one ethylenically unsaturated group and (c) a mixture of (a) and (b); said liquid reactive plasticizer being capable of solvating the PPO at the fluxing temperature and being present in an amount ranging from 5 to 2,000 parts per 100 parts by weight of (1); and (3) 0.01 to 10% by weight of (2) of either a thermal initiator or photoinitiator for plasticizers present in the composition. Plastisol dispersion after fluxing can form a thermosetting after the crosslinking reaction.

U.S. Pat. Nos. 4,523,983 and 4,568,405 describe reactive plastisol dispersions comprising (1) a polyvinyl acetal thermoplast in particle form;
(2) a liquid plasticizer;
(3) a free radical thermal initiator or
(4) a photoinitiator for crosslinking. The reactive plastisol dispersion when fluxed can be useful as a sealant or adhesive.

U.S. Pat. No. 3,615,448 describes a lithographic (planographic) printing plate prepared from an element comprising a layer of a photocurable composition containing finely divided particles of a vinyl plastic. The layer is exposed imagewise to U.V. radiation, which photocures the photocurable composition, and then is uniformly heat fluxed, whereby the photocurable composition plasticizes the plastic vinyl in the nonexposed areas. The imagewise exposure is through a stencil, or a negative or positive transparency (halftone or line). The exposed areas are either oleophilic or hydrophilic in relation to the nonexposed areas. The homopolymer of vinyl chloride is the preferred vinyl plastic.

U.S. Pat. No. 4,465,572 describes thermally coalescible acrylic resin plastisol or organosol dispersions of reduced viscosity and thixotropy result when 0.2 to 40% by volume of the total volume Of the dispersion of a volatile solvent is incorporated in compositions comprising particles of single-phase, random acrylic polymers or copolymers dispersed in nonvolatile plasticizers. Incorporation of a nonvolatile photopolymerizable component provides photosensitive dispersions useful for making relief and planographic printing plates, photoresists, and the like.

U.S. Pat. No. 4,4211,619 describes thermally coalescible acrylic resin dispersions comprising particles of single-phase, surfactant-free, random acrylic polymers or copolymers, containing at least 80% by weight of acrylic units, dispersed in a surfactant-free medium that comprises a compatible liquid plasticizer that is nonvolatile at room temperature and is not a monomer of any of the polymeric components. Incorporation of a photopolymerizable, ethylenically unsaturated compound provides photosensitive dispersions useful for making relief and planographic printing plates, photoresists, and the like.

U.S. Pat. No. 4,309,331 describes thermally coalescible acrylic resin dispersions comprising particles of single-phase, surfactant-free, random acrylic polymers or copolymers, containing at least 80% by weight of acrylic units, dispersed in a surfactant-free medium that comprises a compatible liquid plasticizer that is nonvolatile at room temperature and is not a monomer of any of the polymeric components. Incorporation of a photopolymerizable, ethylenically unsaturated compound provides photosensitive dispersions useful for making relief and planographic printing plates, photoresists, and the like.

U.S. Pat. No. 4,276,366 describes photoactive, thermally coalescible resin plastisol dispersions comprising a polyvinyl chloride polymer having attached to the polymer backbone photopolymerizable or photocrosslinkable groups dispersed in a liquid plasticizer medium, and a photoinitiator which is either a separate component or a photoactive substituent present on the polymer backbone. The photoactive plastisols, in element form, can be used in an image formation process that is a positive working washout or negative toned imaging system.

U.S. Pat. No. 4,251,618 describes photoactive, thermally coalescible resin plastisol dispersions comprising a polyvinyl chloride polymer having attached to the polymer backbone photopolymerizable or photocrosslinkable groups dispersed in a liquid plasticizer medium, and a photoinitiator which is either a separate component or a photoactive substituent present on the polymer backbone. The photoactive plastisols, in the element form, can be used in an image formation process that is positive working washout or negative toned imaging system.

U.S. Pat. No. 4,176,028 describes thermally coalescible plastisols and organosols of the invention comprise dispersions of single-phase particles of random polymers or copolymers that comprise organic polyelectrolytes that contain at least 1% by weight of ionizable monomer or comonomer, dispersed in a medium that comprises a nonvolatile liquid that is compatible with the resin. Incorporation of a photopolymerizable, ethylenically unsaturated compound provides photosensitive plastisols and organosols useful for making relief and planographic printing plates, photoresists, and the like.

U.S. Pat. No. 4,125,700 describes methyl methacrylate polymer powders especially suitable for making plastisols and organosols are prepared by an improved process comprising stepwise emulsion polymerization in aqueous media in the absence of emulsifiers and surfactants and in such manner that at least most of the monomer added at each step is consumed before the addition of the succeeding portion, followed by isolation of the polymer powder by evaporation of the latex at a temperature that is at least 30° C., preferably 40°–50° C., below the glass transition temperature of the polymer.

Belgian Patent 865180 describes a thermally coalescible organosol or plastisol comprises a dispersion of an acrylic (co)polymer in a medium comprising (a) a compatible, non-volatile liquid which is not a solvent for a polymer and is not a monomer having the same chemical structure as that of the monomer from which the (co)polymer is derived, and (b) $<=40$ vol. % (5–40 vol. %) based on total dispersion, of a volatile liquid which can dissolve or swell the polymer at room temp., pref. a chlorinated hydrocarbon, e.g., methylene chloride. The copolymer contains $>=50$ wt. % acrylic units. The plastisols or organosols have low initial viscosity, low thixotropy and can be filtered. They can be made photosensitive by inclusion of a photopolymerizable monomer and the compositions obtained used e.g., to prepare relief and lithographic printing plates and photoresists.

In all cases of the related art discussed above, concerning thermally coalescible photoformable compositions, single coatings or single layers of such compositions are photoformed throughout their total depth in photoexposed regions, so that control of depth of photoforming is not critical. In contrast, when making multilayer three dimensional structures, control of the depth during photoforming the individual layers is extremely important for making models and prototypes (objects) with high resolution and high accuracy.

SUMMARY OF THE INVENTION

The instant invention is directed to a method for fabricating three-dimensional objects from contiguous layers of a photoformable liquid, the liquid comprising thermally coalescible materials. It more specifically refers to a method for accurately fabricating an integral three dimensional object from a multiplicity of imagewise photoformed contiguous layers of a thermally coalescible photoformable liquid composition comprising the steps of:

(a) forming a layer of a thermally coalescible photoformable liquid;

(b) imagewise exposing areas of at least a portion of the layer to actinic, radiation;

(c) introducing a new layer of liquid onto the layer previously exposed imagewise to actinic radiation according to step (b);

(d) imagewise exposing areas of at least a portion of the new liquid layer to actinic radiation preferably in register with the requirement that the photoformable composition comprises a thermally coalescible polymeric cohesive material, a photohardenable monomer, and a photoinitiator, wherein after the exposure to the actinic radiation, the photoformed areas of the composition remain thermally coalescible;

(e) successively repeating steps (c) and (d) until all layers of the three dimensional object have been photoformed and connected through joining surfaces;

(f) in sequence
  (i) removing the unexposed portion of the photoformable composition from the exposed portion of the three dimensional object, and
  (ii) thermally coalescing the three dimensional object in order to promote cohesion both within the contiguous layers and at the joining surfaces between the contiguous layers.

Preferably, the photohardenable monomer comprises an ethylenically unsaturated monomer, and at least one of the layers possesses an infraposed surface in addition to the joining surfaces.

BRIEF DESCRIPTION OF THE DRAWING

The reader's understanding of practical implementation of preferred embodiments of this invention will be enhanced by reference to the following detailed description taken in conjunction with perusal of the drawing figures, wherein:

FIG. 3 illustrates (a) a single layer made with a composition lacking the benefits of the present invention; and (b) a single layer according to the teachings of the present invention.

DETAILED DESCRIPTION OF THE INVENTION

As aforementioned, the instant invention is directed to a method for accurately fabricating an integral three dimensional object with excellent interlayer adhesion from a multiplicity of partially photoformed contiguous layers of a thermally coalescible photoformable liquid composition.

A liquid thermally coalescible photoformable composition is a composition which solidifies upon exposure to actinic radiation without attaining necessarily its ultimate physical properties, particularly with respect to their adhesive and cohesive characteristics. However, it develops adequate integrity to be handled until such time when further treatment is provided. The composition is considered as coalescible when it comprises particulate matter in dispersed form, which particulate matter undergoes coalescence under a certain set of conditions, such as increased temperature for example. Coalescence is the transformation of a dispersed phase to a cohesive continuous solid phase.

Figure 1:
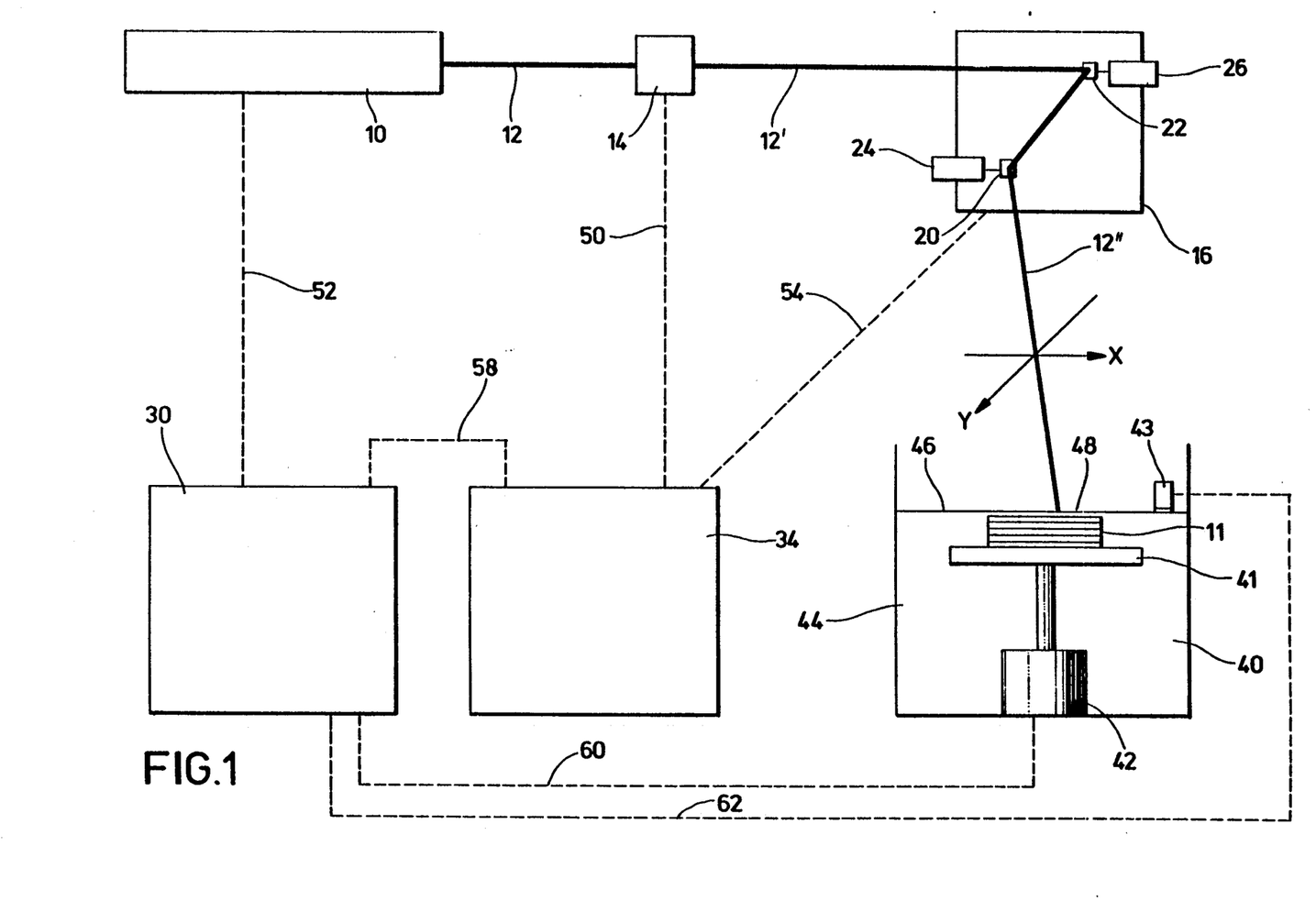
FIG. 1 is a schematic diagram showing the apparatus utilized in the practice of the preferred embodiment of the instant invention.

The apparatus utilized in the preferred embodiment for the practice of this invention is illustrated in FIG. 1.

In reference to FIG. 1, there is provided radiation means 10, such as a laser, producing a radiation beam 12. Being desirable to produce solid objects at high speed, the apparatus of the instant invention preferably utilizes relatively high power radiation means 10, such as high power lasers, which may have major bands in the visible, infrared, or ultraviolet regions. High power is considered to be a power greater than 20 mW, and preferably over 100 mW as measured from the intensity of radiation beam 12. This is so with the present photospeeds of currently used photosensitive components of the composition. However, as faster compositions become available, the values of 20 mW and 100 mW for the beam intensity will become lower accordingly, since photospeed of the composition and intensity of the radiation beam have an inverse relation to each other in order to achieve the same results. The selection of a certain type of laser should be coordinated with the selection of the composition in a way that the sensitivity of the composition agrees reasonably well with the wavelength of the laser's emission. Other types of actinic radiation means may also be utilized such as electron beams, x-rays, and the like. Although means may be provided to modify the shape of the beam cross-section to any desirable shape, the ordinary shape is circular, and the profile of the intensity of the beam is gaussian with a maximum at the center of the circular shape.

modulator being preferably an acousto-optical modulator. The modulated radiation beam 12' passes in turn through deflection means 16, which comprises two mirrors 20 and 22, each mirror having an axis (not shown), allowing reflection of the beam to surface 46 in X and Y directions, the X and Y directions being perpendicular to each other and parallel to surface 46. The mirrors 20 and 22 may rotatably move around their corresponding axes by means of motors 24 and 26, respectively for controllably deflecting the beam in a vector scanning mode, in the X and Y directions, towards predetermined positions of a liquid photoformable composition 40, contained in vessel 44. Examples of suitable photoformable compositions are given at a later section of this description. As the beam is deflected by the deflection means 16, it assumes an acceleration from zero level to a maximum acceleration and a velocity from zero level to a maximum constant velocity. The velocity and the intensity of the beam remain proportional to each other, so that the exposure remains substantially constant. The beam causes photoforming of preselected portions of the composition to a substantially constant depth of photoforming. Depth of photoforming is defined as the maximum or peak thickness between surface 46 and the opposite side of the photoformed layer, when measured on a cross section normal to the direction of scanning. Such mechanical means to control depth are not wholly adequate in multilayer imaging, where underlying layers may be still photoactive, during the time at which overlying layers are being exposed in a different pattern.

Within vessel 44, there is provided a movable table 41. The table has preferably a multiplicity of perforations for facilitating the flow of the photoformable composition during movement of the table.

Placement means 42 provide a motion to the movable table 41 in order to accurately control placement of the movable table within the vessel 44. Placement means 42, such as an elevator motor, is adjacent to vessel 44 and connected to table 41 through supporting-arm 80. Supporting-arm 80 is also coupled to a counter-arm 90 through coupling means, shown in FIG. 1 as a cable 93 passing over pulleys 95 and 95', so that when the supporting-arm 80 moves in one direction, the counter-arm moves in the opposite direction. What mechanism is provided to perform this operation is not material. It is only important that the coupling means provide a motion of the supporting-arm and the counter-arm in opposite directions with respect to each other. A micro switch (not shown) may be used generally in the vicinity of the coating station, and preferably in the vicinity of the supporting-arm 80, or any extension thereof in order to accurately register and control the initial or other position of table 41 with respect to the position of a desired level of surface 46. The micro switch may cause the placement means 42 to stop when the table 41 reaches a predetermined position, in a simple case; or it may give a signal to the computer means 34, which in turn may cause a desired action to occur. More than one critical positions may also be registered and controlled by the use of a proportional number of micro switches. By "micro switch" is meant any switching device such as for example mechanical, electromechanical, electrical, electronic, magnetic, electromagnetic, sonic, optical, contact, approach, and the like, or combinations thereof. Conventional techniques may be used to mount the switches in the vicinity of supporting-arm 80 or extension thereof, including counter-arm 90 and the coupling mechanism or extensions thereof. Also conventional techniques may be used to trigger the switches at the different predetermined positions.

Layer forming means, such as a doctor knife 43 is located over the table 41 within vessel 44, for forming contiguous layers of liquid photoformable composition and for accelerating the production and uniformity of said layers. It is preferable that the doctor knife is removable from its operational position for facilitating its maintenance. Other arrangements, such as a double, triple or in general multiple doctor knife, may also be used.

There is also provided computer means 34. The computer means 34 is coupled with the radiation means 10, the radiation means 14, the deflection means 16, the placement means 42, and the layer forming means 43 through control/feedback lines 52, 50, 54, 60, and 62, respectively. Ancillary and obvious devices are not shown for the purpose of simplicity.

It may be seen in FIG. 1 that the apparatus utilized in the practice of the preferred embodiment of the present invention may be divided into two segments; namely, an imaging station or imaging means and a coating station. The imaging means preferably comprises radiation means (10), modulation means (14), radiation deflection means (16), and computer means (34), interconnected with each other as described above, and operating as described below. The coating station preferably comprises a vessel (44) for containing a liquid photoformable composition (40), a movable table (41), placement means (42), a supporting-arm (80), a counter-arm (90), and coupling means (cable 93 with pulleys 95 and 95'), interconnected and operating as described in this text. In operation, the radiation means 10 shown in FIG. 1, which is preferably a high power laser, provides a radiation beam 12 having an intensity as aforementioned. The radiation beam 12 passes through a modulator 14, where its intensity may be modulated from zero intensity level to a maximum beam intensity having a value less than that of the unmodulated beam intensity, due to energy losses. Different kinds of modulators can be used including both digital and analog types. The digital type is preferable since it incorporates higher electronic stability and flexibility to the system, acousto-optical modulators being preferred. The modulated radiation beam 12', having somewhat decreased intensity due to losses, passes in turn through deflection means 16 such as a vector scanner in the form of a two-mirror 20 and 22 assembly, each mirror separately driven by a different motor 24 and 26 respectively. Mirror 20, driven by motor 24 deflects the beam in a X direction, while mirror 22 deflects the beam in a Y direction, X direction being perpendicular to the Y direction. The radiation beam 12", also somewhat lower in intensity due to additional losses, is directed towards a thin layer 48 closest to the surface 46 of a photoformable composition 40, which is contained in a vessel 44, where it induces photoforming of preselected portions of the thin layer 48. In the preferred embodiment, the composite movement of the beam is a vector type movement, and the beam is said to move or be scanned in a vector mode. However, this invention may practiced with raster or any other type of scanning. Due to the inertia of the electromechanical deflection means 16, the velocity of the beam 12" on the thin layer 48 is also limited by the inertia and the electromechanical nature of the deflection means The deflection of the two mirrors 20 and 22 connected to motors 24 and 26, and the modulation means 14 are controlled by computer means 34 through control/feedback lines 54 and 50, respectively. The graphic data corresponding to the shape of the solid object under production are also stored in computer means 34. The graphic data stored in computer means 34, after being processed cause motors 24 and 26 to turn and move mirrors 20 and 22 accordingly in order to deflect the radiation beam towards predetermined positions on the thin layer 48. Electrical feedback regarding the relative movements of the mirrors 20 and 22 is provided by the deflection means to computer means 34 through line 54. This feedback, being correlatable to the velocity and average residence time of the beam on the predetermined portions of the thin layer 48, is processed by computer means 34, and it is fed to the modulation means 14 as a control command through line 50 in order to modulate the average intensity of the radiation beam, so that the product of the intensity of the beam and the average residence time at each position of the predetermined portions of layer 48 remains substantially constant. Thus, the exposure level, being by definition the product of these two parameters, remains substantially constant. By maintaining the exposure level constant over the predetermined portions of each contiguous thin layer, the depth of photoforming is also kept substantially constant. This correction or compensation is very important, especially at unsupported portions of the thin layers, where swollen edges will appear as a result of overexposure due to the low initial velocity at the edges in vector scanning. The higher the intensity of the beam 12" or the higher the photosensitivity of the photoformable composition the more severe this problem becomes in the absence o means to maintain the exposure level constant. Also, the greater the sensitivity of the composition 40, the more severe the problem becomes without some means of exposure control.

The movable table 41 is initially positioned within the photoformable composition 40, a short predetermined distance from the surface 46, providing a thin layer 48 between the surface 46 and the table 41. An approach-type micro switch (not shown), located near the supporting-arm 80 and activated by the same, gives a signal to the computer means 34 when the movable table 41 assumes the desired position. The actual positioning of the table is provided by the placement means 42 through supportarm 80, the placement means 42 is in turn controlled by the computer means 34 according to the data gathered and stored therein.

Graphic data corresponding to the first layer of the shape of the rigid object 11 are processed in computer means 34 along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from computer means 34. Following a similar command, layer forming means, such as doctor knife 43 sweeps the surface 46 for leveling purposes. The same procedure is then followed for producing the second, third, and the following layers until the rigid object 11 is completed.

It is very important that the level of surface 46 of the photoformable liquid 40 in vessel 44 attains a desirable value during the operation, so that the table 41 registers accurately in every step in order to form the solid object 11 within tight tolerance limits. However, as the supporting-arm 80 moves down during the formation of solid object 11, more and more liquid 40 is displaced by the immersed portion 81 of supporting-arm 80 which occupies a first volume within the liquid, raising the level of surface 46. The counter-arm 90 having an immersed portion 91 occupying a second volume, is moveably connected to supporting-arm 80, so that when the immersed portion 81 of supporting-arm 80 increases, the immersed portion 91 of counter-arm 90 decreases controllably and vice-versa, in a way that the sum of the first volume and the second volume attains a desired value, and therefore, the level of surface 46 also attains a desired value.

For all practical purposes, in the majority of cases adequate accuracy is received when the sum of the first volume and the second volume remains substantially constant, so that the level of surface 46 is also maintained at a substantially constant position attaining a substantially constant value. Thus, it is preferable that arms 80 and 90 are constructed in a way to have the same cross-sectional area both with respect to each other and throughout Since, however, shrinkage takes place in many instances (or growth in rare instances) during photoforming, it may be desirable to construct counter-arm 90 with smaller or larger constant (throughout its length subject to immersion) cross-sectional sectional area than that of supporting-arm 80 to compensate for shrinkage or growth, respectively. In addition, arms 80 and 90 may be constructed with varying cross sectional areas both with respect to each other and throughout the length of each one to compensate for other volumetric parameters, such as for example considerable local or accumulative changes in the cross-sectional areas of the integral solid object 11, which in turn may produce variable volume changes resulting from shrinkage or growth, changes due to immersion of extraneous elements, and the like. Some times it may also be desirable for the level of the surface to attain different but controlled values. This can be achieved by shaping the two arms in a way to assume the desirable sum of the first and second volume at the different points of the operation, which in turn controls the value of the level of surface 46 taking into account the volume of photoformable liquid composition 40 contained in vessel 44.

In the practice of the present invention it is required that the photoformable composition comprises a thermally coalescible polymeric cohesive material, a photohardenable monomer, and a photoinitiator. Preferably the photohardenable material comprises an ethylenically unsaturated monomer. Upon exposure to the actinic radiation, even the exposed areas of the photoformable composition must remain thermally coalescible after removing the unexposed areas. This is important to improve both adhesion in the joining surfaces between the layers and cohesion within the layers for a multilayer integral three dimensional object. Actually, cohesive bonds are formed at the joining surfaces by the thermally coalescible material providing superior properties to the structure of the final three dimensional object. It is also very important to prevent substantial overgrowth of infraposed surfaces, as it will be discussed below. Thus, a major benefit of the instant invention is realized when an infraposed surface is present.

When all the layers of the three dimensional object have been formed, the unexposed portions of the composition may be removed by any conventional means, such as shaking the object, blowing gas towards the object, and the like. Further removal may be achieved by rinsing the object with poor, noncoalescing solvents. Water, alcohols, and in general polar solvents are poor solvents for non-polar compositions and vice-versa. As long as the solvent under consideration does not extract excessive amounts of materials from the exposed area or it does not swell excessively the object to be rinsed within the rinsing time, is considered to be a poor, noncoalescing solvent.

The object then is thermally coalesced in order to develop high cohesive and adhesive strength. This step may be performed in an oven, such as convection, IR, microwave, and the like. Optimum temperature and time are dependent on the individual composition. Typically the temperature range is 100°–250° C. and the time range is 5–30 minutes. However, temperature and times outside these regions may be used.

The thermally coalesced three dimensional object may be considered as a single object. A number of different single objects may be put together to form integral complex objects, according to other embodiments of this inventions. Thus, such integral complex object may be fabricated initially repeating the steps used in the method described above in order to fabricate at least one additional single integral three dimensional object, each single object thus fabricated having at least one first preselected matching surface intended to match a second matching surface, the second surface being part of at least one other single object; then applying a coating of thermally coalescible composition on at least one of the first and second matching surfaces; bringing the first matching surfaces in contact with the second matching surfaces; and thermally coalescing the coating of the thermally coalescible composition within the first and second matching surfaces in order to form a strong bond between the first and second surfaces, thus completing the fabrication of the integral complex object. The thermally coalescible composition used for the coating is preferably of the same or similar to the composition used for making the single objects.

According to another embodiment of this invention the additional coating is not necessary. For the additional coating not to be necessary, it is required that at least one of the matching surfaces has to belong to a single object, which has not been coalesced before. This can be achieved by repeating the steps used in the method for preparing single objects as discussed above, except for step (f)(ii) which is omitted in order to fabricate at least one uncoalesced single integral three dimensional object. Each uncoalesced single object thus fabricated should have at least one third matching surface intended to match a fourth matching surface, the fourth matching surface being part of at least one other single object. The third matching surfaces are then brought in contact with the fourth matching surfaces. A step of thermally coalescing the uncoalesced single object in order to form a strong bond between the first and second surfaces, is then followed in order to complete the fabrication of the integral complex object.

Figure 2:
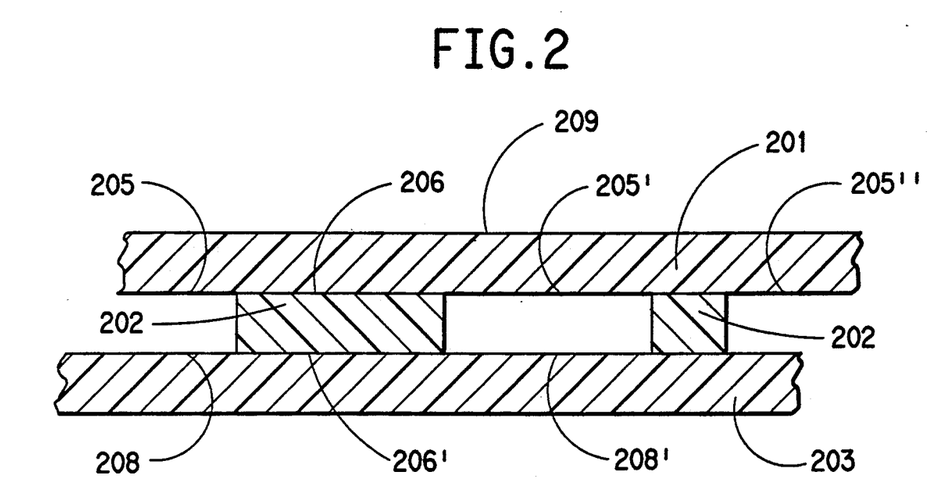
FIG. 2 illustrates schematically three contiguous layers having joining surfaces, and the upper layer also having infraposed surfaces.

Referring now to FIG. 2, there are illustrated three contiguous layers of the three dimensional object; an upper layer 201, a middle layer 202, and a lower layer 203. The layers are connected to each other through joining surfaces, such as 206, and 206'. The designation "surfaces" is used here regardless of whether the surfaces are free or they have been joined to form what is usually called an "interface". Thus, surface 206', for example, is shared by and belongs to both layer 202 and layer 203. Under the same token, surface 205' belongs only to layer 201, while surface 208' belongs only to layer 203.

The layers also have directly exposed surfaces, such as 209 of the upper layer, and 208 and 208' of the lower layer. By "directly exposed surface" is meant the surface which has been formed by directly exposing it to radiation according to the aforementioned method, without the radiation having passed through a layer of photoformable liquid. In addition, the layers have "infraposed surfaces", such as surfaces 205, 205', and 205" on the upper layer 201. An infraposed surface is formed by radiation which has already passed through liquid composition, and constitutes a surface such as 205 or 205' opposite to a directly exposed surface, such as 209 of layer 201. For all practical purposes, both directly exposed surfaces and the corresponding infraposed surfaces are formed simultaneously.

It is important to note that a joining surface, such as 206, is formed by actually joining a directly exposed surface of the middle layer 202 to an infraposed surface of the upper layer 201. Nevertheless, for the purposes of this discussion, when referring to infraposed surfaces, we mean free infraposed surfaces, such as 205'. Thus, layer 201 is restricted from growing under surface 206 by layer 202 which acts as a solid substrate. However, layer 201 is free to grow under the free infraposed surface 205', depending on the radiation exposure. A significant problem then arises, not so much because of this differential sensitivity in thickness progression, but mainly by the fact that in order to achieve adequate adhesion at joining surfaces, such as 206, when using the presently available to us compositions, an excess of radiation is required, which necessarily results in overgrow of layer 201 under the infraposed surfaces, such as 205, 205', and 205". This is translated to loss of resolution and loss of specified tolerances when infraposed surfaces are present within the layers of the three dimensional object. This is a unique problem to solid imaging, and it is not encountered in two dimensional imaging.

The instant invention successfully circumvents this devastating problem by utilizing photoformable compositions containing thermally coalescible materials. In the case of the present invention, only adequate radiation is needed to give slightly higher thickness than the desired one, since only minimal adhesion to hold the layers through their joining surfaces is needed. The final strength and potent adhesion is achieved by major thermal coalescence (see Example 6), through cohesive bonds formed by the thermally coalescible material. Although thermal treatment may also be of some help to other presently used compositions, by no means it is of such magnitude to overcome the aforementioned problem. This is mainly because these compositions, lacking the benefits of thermally coalescible materials, are based solely on mechanisms of photopolymerization and/or cross linking for formation of the layers, cohesion within the layers, and adhesion between the layers. However, with the increased amount of photopolymerization and/or cross linking required to achieve acceptable cohesion, the potential for good adhesion drops rapidly. At the same time, photopolymerization and/or cross linking also increases the glass transition temperature very fast and makes the compositions infusible, which in turn results in lower mobility and therefore retardation of further cross linking at both low and higher temperatures. This phenomenon is very clearly demonstrated by Examples 5 and 6, where two separate layers made according to the teachings of the present invention were adhered together successfully by thermal coalescence, while two layers made with a composition lacking the benefits of this invention, could not be adhered to each other by the same treatment.

Figure 3A:
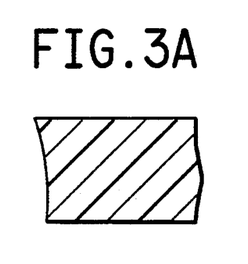
Figure 3B:
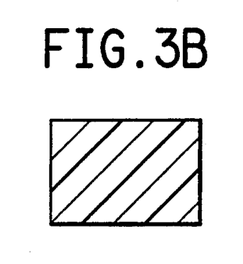

Another very important advantage of the present invention is that it provides layers and final three dimensional objects of very low shrinkage if any, matching to the original size, and of substantially no warpage or deformation, especially in areas where the layer is not supported by a solid substrate (for example a polymerized area of the previous layer), as illustrated in Table 1 of Example 1 and FIG. 3. In case (a) a single layer over unexposed liquid was made with a composition lacking the benefits of this invention, and in case (b) a similar layer was made according to this invention. In order to achieve good resolution and accuracy, the layers, and even more so the areas of the layers not being supported by solid substrate, have to have good integrity, flatness, and size match to the original, preferably under a wide range of exposures, so that one may easily choose the desired layer depth to build the three dimensional object. This is achieved by the present invention. In contrast, in the case of the current state of the art, only narrow exposure latitude can be attained without severe deformation, and loss of resolution and accuracy.

During polymerization, shrinkage occurs usually; the higher the conversion the higher the shrinkage. Warpage on the other hand is the result of differential shrinkage within and between layers. Shrinkage by itself, if uniform, is not as difficult to overcome as warpage. Thus, when attempting to improve the physical strength of the object, which increases with degree of polymerization or cross linking, one confronts the problem of deformation because of increased shrinkage and warpage.

These problems are overcome by the present invention. The thermally coalescible material provides a way to significantly reduce the level of photohardenable monomer in the composition, and thus induce much less shrinkage during exposure. The cohesive and adhesive strength can then be improved by a subsequent coalescing step after removal of the unexposed areas. Little or no shrinkage occurs during thermal coalescence. Currently, acceptable adhesion is obtained by choosing an exposure which gives much higher thickness or depth than the desired one. This manifests itself as overgrowth of the infraposed surfaces.

Figure 4:
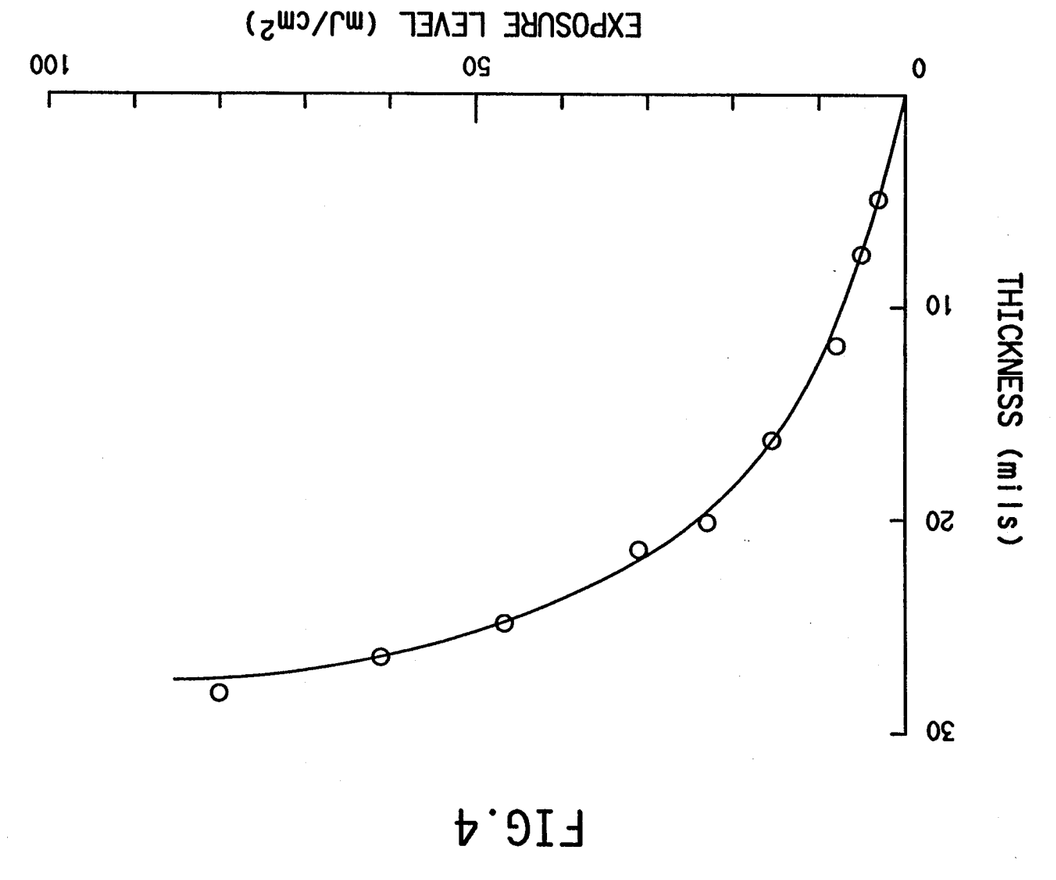
FIG. 4 illustrates the self limiting characteristics regarding photoforming depth of layers according to the present invention.

In addition to the above, thickness-limiting characteristics are observed as described in Example 2, and illustrated in FIG. 4. The higher photospeed attainable according to the instant invention (composition B versus Composition A in Table 1 of Example 1) further enriches its advantageous characteristics.

According to this invention, a very important group of thermally coalescible materials are plastisols. Plastisols are fluid mixtures, ranging in viscosity from pourable liquids to heavy pastes, obtained by dispersing fine particle size polymeric resins in nonvolatile liquid thermal plasticizers, i.e., materials which are compatible with the polymer or resin and increase its workability and flexibility but have no substantial solvent activity for the resin or polymer under ordinary conditions of storage (e.g., room conditions). When the plastisol has been formed into a desired shape, e.g., by molding or coating, it can be heated to coalesce the polymeric resin particles and the nonvolatile liquid constituent, thereby forming a homogeneous solid mass. Volatile diluents can be added to plastisol dispersions to modify their viscosity and to achieve desirable handling characteristics in coating or other forming operations. A dispersion that contains no more than 10% volatile diluent is regarded as a plastisol. Since the plasticizer used in the case of plastisols acts as a plasticizer to solvate the polymer only at higher temperatures than storage temperatures, it may also be called thermal plasticizer.

The most widely used plastisols are based on polyvinyl chloride homopolymer in a plasticizer. Dispersion resins (particle size 0.1 to 2 micrometer range) are generally used. They are characterized by the polymer type (homopolymer or copolymer with vinyl acetate or polyvinyl chloride containing carboxyl functional groups) molecular weight and size, shape and distribution of particles. Resins of a given molecular weight are usually chosen according to the physical requirements of the finished product. High molecular weight resins yield higher physical strength. Copolymers are used when lower fusion temperature is required. Particle size, shape, and distribution have significant effect on plastisol rheology. Blending resin (particle size range 10–150 microns) may be incorporated with the dispersion resin. They usually have low oil absorption which reduces the viscosity of the plastisol at a given plasticizer level.

Polyvinyl chloride has been described in the literature as the primary polymer used in forming plastisols. Polyvinyl chloride plastisols have been described in U.S. Pat. No. 3,795,649 wherein the polyvinyl chloride is copolymerized with other monomers, that constitute a minority (35%) of the polymer composition. In U.S. Pat. No. 2,618,621 there are disclosed polyvinyl chloride plastisols wherein part of the plasticizer content is replaced with an acrylic monomer, which is then conventionally thermally polymerized at the temperature encountered in the step of coalescing the polyvinyl chloride resin.

Polyvinyl chloride plastisol dispersions can be made photoactive by incorporating therein a photosensitive monomer and photoinitiator, such as described in U.S. Pat. No. 4,634,562, or by having attached to the backbone of the polyvinyl chloride polymer photopolymerizable or photocrosslinkable groups, such that upon exposure to actinic radiation, the modified polyvinyl chloride polymer becomes polymerized or crosslinked. Such compositions may be used, preferably as part of the total coalescible material, or as part or total of the unsaturated monomer. The photoinitiator may also constitute part of the polymer, as described for example in U.S. Pat. Nos. 4,251,618 and 4,276,366, and be employed by the present invention, preferably as part of the total coalescible material.

In general, polyvinyl halides, polyvinylidene halides, polyvinyl halide acetates, polyvinylidene halide acetates, polyphenylene oxide, polyvinyl acetal, and mixtures thereof may be used effectively as thermally coalescible polymers. It is preferable that the halide is chloride and or fluoride. Polyvinyl halide compositions usually include thermal stabilizers, well known in the art. Stabilizers have the ability to accept the hydrogen halide which is released from the polymer as a result of thermal degradation. They also prevent discoloration. Materials commonly used as stabilizers are the Barium-Cadmium-Zinc types. They are frequently improved through addition of epoxidized oils and phosphates (chelates).

Polyelectrolyte compositions, such as described in U.S. Pat. No. 4,176,028, as well as acrylic and methacrylic plastisols, such as described in U.S. Pat. Nos. 4,421,619, 4,309,331, 4,465,572, 4,125,700 and Belgian Patent 865,180 may also be used. Other thermally coalescible compositions, such as those described in U.S. Pat. Nos. 4,523,983, 4,568,405, and 4,623,558 are also examples of compositions which may be employed in the practice of the present invention.

Plasticizers used in plastisols are generally categorized either by function or structure. Structurally, they may be classified as monomeric or polymeric, and functionally, as primary or secondary. Plasticizers which have good permanence, compatibility, and plasticizing efficiency are considered primary; less compatible ones are secondary. Typical non-polymerizable plasticizers for polyvinyl chloride resins include but are not limited to: Diisodecyl phthalate, Diisononyl phthalate, Diisooctyl phthalate, Di-2-ethylhexyl phthalate, Di-2-ethylhexyl azelate, Diisodecyl adipate, n-octyl-n-decyl adipate, Diisononyl adipate, Di-2-ethylhexyl adipate, C7 and C9 adipate, n-C6-C8-C10 phthalates, n-octyl-n-decyl phthalates, Ditridecyl phthalate, Tri-2-ethylhexyl trimellitate, Triisononyl trimellitate, n-octyl-n-decyl trimellitate, Polyester (Paraplex G-54, of Rohm & Haas Co., Plastolein 9750 of Emery Industries, Inc.), Butyl Benzyl phthalate, Dihexyl phthalate, Butyl Octyl phthalate, Tricresyl phosphate, Cresyl diphenyl phosphates, 2-ethylhexyl diphenyl phosphate, Decyl diphenyl phosphate, Dicapryl phthalate, Di-2-ethylhexyl isophthalate, epoxide containing plasticizers such as epoxidized soybean oil, octyl epoxy tallate, and isooctyl epoxy tallate, hydrocarbons, chlorinated hydrocarbons and others.

Polymerizable plasticizers may be used together with nonpolymerizable plasticizers. They include but are not limited to 1,3-butylene glycol dimethacrylate, trimethylol propane bis(methacrylate), trimethylol propane trimethacrylate.

Plasticizers have a profound effect in all aspects of plastisols including viscosity, rheological properties, storage ability, fusion temperature, application method, and ultimate physical properties (for example, tensile strength, % elongation, flame retardation and permanence after the thermal coalescing step). They must be carefully considered in plasticizer selection for the particular polymer dispersion resin in question. Two or more plasticizers are commonly used in addition to the epoxide plasticizer since the epoxides give additional improvement in heat stability along with barium-cadmium-zinc stabilizers for polyvinyl chloride dispersion resins. Through proper combination of polymer dispersion resins and plasticizers, stabilizers, fillers, viscosity modifiers, etc., a wide range of properties may be attained upon thermal coalescence. For example, ultimate tensile and tear strength is obtained when using high molecular weight polymer resin, low amount of plasticizer, and sufficient processing time and temperature for complete fusion. To obtain increased elongation, increased amount of plasticizer and copolymer resin (i.e., vinyl chloride with 7% vinyl acetate copolymer) may be used. The applicant has found that a desirable and important property plastisols impart to photoformable formulations is lack of substantial shrinkage during the photoforming and fusion (thermal coalescing) step.

Preferable plasticizers are the ones that are nonpolymerizable. Monomers are important ingredients in this invention. They provide means to photoharden and entrap within their hardened frame structure the substantially photo-inactive plastisol. After isolating the exposed and photoformed part from the unexposed portion of the composition, the exposed part is thermally treated to coalesce the entrapped plastisol in order to form a solid mass integrated with the polymerized photopolymer areas within layers and between layers. One or more monomers may be used in the formulation. Also, for the purposes of this invention, monomers and oligomers have the same meaning and the these terms may used interchangeably. As it is discussed at a later section, even photohardenable polymers may be utilized, preferably in part. When selecting monomer(s), factors like photoactivity, toxicity, compatibility, stability and ultimate physical properties should be considered. In this invention the monomer(s) to plastisol ratio is another important parameter to be considered for tailoring the ultimate physical properties of the photoformed and coalesced object. Monomers may be mono-, difunctional, trifunctional or multifunctional acrylates, methacrylates, vinyl, allyl, and the like. They may comprise other functional and/or photohardenable groups, such as epoxy, vinyl, isocyanate, urethane, and like, either by themselves if they are capable of rendering the monomer photohardenable, or in addition to acrylates or methacrylates.

Examples of suitable ethylenically unsaturated monomers which can be used alone or in combination with other monomers include but are not limited to t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(phydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Also included are all methacrylates, tetrahydro-furfuryl methacrylate, cyclohexyl methacrylate, diallylfumarate, n-benylacrylate, carebowax 550 acrylate, methyl cellosolve acrylate, dicyclopentenyl acrylate, isodecyl acrylate, 2(2-ethoxyethoxy) ethylacrylate, polybutadiene diacrylate, tris (2-hydroxyethyl) isocyanurate triacrylate, epoxy diacrylate tetrabromo bisphenol A diacrylate. Monomers with vinyl group like vinyl pyrol, N-vinyl pyrolidone and vinyl ethers are usable. Also, oligomers with mono or multifunctional groups such as the ones with carbon group for alkali removability, and the ones with both acrylate and isocyanate end groups are useful. Particularly preferred monomers are polyoxyethylated trimethylolpropane triacrylate, ethylated pentaerythritol triacrylate, dipentaerythritol monohydroxypentaacrylate and 1,10-decanediol dimethylacrylate. Others are caprolactone acrylates and methacrylates, propoxylated neopentyl glycol diacrylates and methacrylates.

Di-(3-acryloxy-2-bydroxypropyl) ether of bisphenol A and Di-(3-methacryloxy-2-bydroxypropyl) ether of bisphenol A oligomers, generally referred to as unsaturated bisphenol A oligomers are of particular interest because they provide higher photospeed; also urethane diacrylates and methacrylates with aliphatic or aromatic backbones, referred to as unsaturated urethane oligomers are of particular interest, because they provide both higher photospeed and higher flexibility.

Monomers which expand on polymerization can be used in part with the standard monomers to achieve compositions giving no shrinkage or warpage upon exposure. These monomers are based on polycyclic ring opening mechanisms. Spiro orthocarbonates, spiro orthoesters and bicyclic ortho esters are known to belong to this class. Typical monomers are norborene spiro orthocarbonate, and bismethylene spiro orthocarbonate. Monomers which undergo cationic polymerization are also useful in this invention. Representative classes of monomers are cyclic ethers cyclic formals and acetals, lactones, vinyl monomers, sulfur containing monomers, organosilicone monomers, monofunctional epoxies, difunctional epoxies, epoxy prepolymers and higher oligomers and epoxy end-capped silicone resins. They can be found in the open literature. One such reference is "Photoinitiated cationic polymerization" by James V. Cirvello in "UV Curing: Science and Technology" edited by S. P. Pappas, published by Technology Marketing Corporation, 1978. Other ring opening monomers can be found in "Ring Opening Polymerization" Edited by K. J. Ivin and T. Saegusa, Elsevier Applied Science Publishers, London and New York, 1984.

In addition to the monomers and oligomers discussed above, photohardenable (photopolymerizable, photodimerizable and photocrosslinkable) polymeric materials may also be utilized within the spirit of this invention, either alone or preferably in combination with the monomers discussed previously. Such materials are given in "Light-Sensitive Systems" by J. Kosar, John Wiley and Sons, Inc., New York, 1965.

Photoinitiators are important ingredients in the present invention. They affect the photospeed, the spectral sensitivity region and, in part, the degree and the depth of polymerization or crosslinking of the photoformable composition. Other additives like sensitizers, chain transfer agents, etc. may also be included.

Photoinitiators for radical polymerization are extremely useful. They can be found in the open literature and as discussed in "UV Curing" under chapter "Photoinitiation of Radical Polymerization" by Pappas & McGinn as mentioned before, and U.S. Pat. Nos. 4,357,416 and 4,286,046. More than one initiator may be used.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; $\alpha$-hydrocarbonsubstituted aromatic acyloins, including $\alpha$-methylbenzoin $\alpha$-allylbenzoin and $\alpha$-phenylbenzoin, others are 1-hydroxycyclobenyl phenol ketone, diethoxyphenol acetaphenone, 2-methyl-1-[4-(methyl thio)phenyl], 2-morpholino-propane-1, benzophenore, Michler's ketone, substituted triphenyl imidazolyl dimers with chain transfer agent camphoquinone etc. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators and photoinhibitors are sensitizers disclosed in U.S. Pat No. 4,162,162. The photoinitiator or photoinitiator system is present in 0.05 to 10% by weight based on the total weight of the photoformable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene- 7,12-dione. Also, $\alpha$-amino aromatic ketones, halogenated compounds like Trichloromethyl substituted cyclohexadienones and triazines or chlorinated acetophenone derivatives, thioxanthones in presences or tertiary amines, and titanocenes.

Typical classes of initiators for cationic polymerization are aryldiazonium salts, diaryliodonium salts comprising nonnucleophilic counterions such as $SbF_6-$, $BF_4-$, $PF_6-$, $ClO_4-$, $CF_3SO_3-$, $AsF_6-$, triacylsulfonium salts, triarylselenium salts or iron arene complex. Examples of these include but are not limited to 2,5-diethoxy-4-(p-tolylmercapto) benzene diazonium $PF_6-$,4-dimethylaminenaphthalene diazonium $PF_6-$, diphenyliodonium hexafluoroarsenate ???, di-t-butyldiphenyliodonium hexafluorophosphate FX-512 solfonium salt (by 3M Company), triethylsulfonium iodide, CG24-61 (by Ciba Geigy). One good reference book is Photoinitiation of Cationic Polymerization mentioned earlier.

Sensitizers useful with these photoinitiators for radical polymerization include but are not limited to methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidine) ketones disclosed in Baum et al., U.S. Pat. No. 3,652,275 and the arylyidene aryl ketones disclosed in Dueber, U.S. Pat. No. 4,162,162, as well as in U.S. Pat. Nos. 4,268,667 and 4,351,893. Useful sensitizers are also listed in Dueber, U.S. Pat. No. 4,162,162 column 6, line 1 to line 65. Particularly preferred sensitizers include the following: DBC, i.e., cyclopentanone; 2,5-bis-[4-(diethylamino)-2-methylphenyl]methylene]-; DEAW, i.e., cyclopentanone, 2,5-bis[4(diethylamino)phenyl]methylene]-; dimethoxy-JDI, i.e.,1H-inden-1-one, 2,3-dihydro-5,6-dimethoxy-2[(2,3,6,7-tetrahydro-1H,5H-benzo[i,j]quinolizin-9-yl)methylene]-, and JAW, i.e., cyclopentanone, 2,5-bis[(2,3,6,7-tetrahydro-1H,5H-b-enzo[i,j]quinolizin-1-yl)methylene]-. Also useful are cyclopentanone 2,5-bis[2-(1,3-dihydro-1,3,3-trimethyl-2H-indol-2-ylidene)ethylidene], CAS 27713-85-5; and cyclopentanone, 2,5-bis-[2-ethylnaphtho[1,2-d]thiazol-2(1H)-ylidene)ethylidene], CAS 27714-25-6.

Sensitizers for cationic polymerization include but are not limited to perylene, acridine orange, acridine yellow, phosphene R, benzoflavin & Setoflavin T.

Hydrogen donor compounds useful as chain transfer agents in the photopolymer compositions include: 2-mercaptobenzoxazole, 2-mercaptobenzothiazole, 4-methyl-4H-1,2,4,triazole-3-thiol, and the like; as well as various types of compounds, e.g., (a) ethers, (b) esters, (c) alcohols, (d) compounds containing allylic or benzylic hydrogen cumene, (e) acetals, (f) aldehydes, and (g) amides as disclosed in column 12, lines 18 to 58 of MacLachlan, U.S. Pat. No. 3,390,996.

Although the preferred mechanism of photoforming is free radical polymerization, other mechanisms of photoforming apply also within the realm of this invention. Such other mechanisms include but are not limited to cationic polymerization, anionic polymerization, condensation polymerization, addition polymerization, and the like, as well as combinations thereof.

Other components may also be present in the photoformable thermally coalescible compositions, e.g., dyes, pigments, extenders, organic or inorganic fillers, organic or inorganic reinforcement fibers, polymerization inhibitors, thermal stabilizers, viscosity modifiers, interlayer and generally interfacial adhesion promoters, such as organosilane coupling agents, coating aids, etc., so long as the photoformable compositions retain their essential properties.

Reinforcement fibers, such as glass, polyester, polyamid, polyimide, polytetrafluoroethylene, and the like at different fiber lengths are very useful for further improvement in physical strength.

Colored photoformed thermally coalescible compositions may be used to paint the object to any desired color and then perform the thermally coalescing step.

A coating of similar composition applied on the surfaces of the solid object may be used to cover or smooth the surface, and/or repair any defects. Also pastes or other thermally coalescible compositions of various consistencies may be used for different types of repairs.

The preferred actinic radiation comprises light, including ultraviolet (UV), visible, and infrared (IR) light, or a combination thereof. From these three wavelength regions of light, ultraviolet is more preferred. Radiation in a beam form, such as that produced by a laser is even more preferred, although imagewise exposure also may be carried out through a stencil or mask according to well known techniques.

EXAMPLE 1

The ability to form an unsupported layer with accurate size and no deformation is extremely important for three dimensional solid imaging applications because the object may have over hanging features. This example is to show the unexpected improvements obtained when a thermally coalescible polymer dispersion in plasticizer is utilized in the photoformable composition. Two liquid photoformable compositions were prepared with the following ingredients by using mechanical stirring. Ingredients 1, 2, and 3 were mixed first until a homogeneous mixture was obtained. Ingredient 4, a commercially available thermally coalescible polymer dispersion, a plastisol, was added only to composition B. Composition A was a clear liquid and composition B was an opaque white liquid.

|  | Composition A | Composition B |
|---|---|---|
| 1. Ethoxylated Trimethylol Propane Triacrylate | 75.0 g | 75.0 g |
| 2. Urethane Acrylate Resin (Sartomer 9610) | 75.0 g | 75.0 g |
| 3. 2,2-dimethoxy-2-phenylacetophenone | 6.0 g | 6.0 g |
| 4. Clear Chem-o-sol R 7557 (made by Whittaker Corp. Providence Chemical Division, East Providence, RI) | None | 225.0 g |

The following general procedure was used to form by means of laser radiation unsupported layers having a directly exposed surface and an infraposed surface. The photoformable liquid composition was poured into a petri dish to give a liquid thickness of one eighth of an inch. It was laser scanned (Argon Ion Laser at 350 nanometers) from the top surface (directly exposed surface) of the liquid to form an unsupported square of one inch in size. The flatness of the square after imaging was observed and recorded. The square was removed from the dish with a pair of tweezers and blotted dry with paper towels. It was checked for size match against a blue colored footprint. The footprint was produced with the same laser scanning condition, except that the photoformable composition was replaced by a photosensitive Dylux paper (made by Du Pont, Imaging Systems Department) at the same imaging plane.

Squares were made at different radiation exposure levels for both compositions. The results are summarized in Table 1 below. Composition B gave excellent image reproduction with excellent flatness, no warpage, and excellent size match over a wide range of exposure levels with excellent photospeed. Composition A gave deformation, warpage, and poor size match for all except one exposure level. This demonstrates that the incorporation of a thermally coalescible materials in the photoformable composition provides unexpected improvements in layer flatness, warpage, and accurate size reproduction to unsupported layers having directly exposed surfaces and infraposed surfaces. In addition, higher photosensitivity was observed in the case of composition B. A square was obtained for composition B, but no image was obtained in the case of composition A at 4.38 mJ/cm². One square (blotted dry) from composition B was thermally treated at 180° C. for 15 minutes. It became translucent from opaque indicating that fusion of plastisol had occurred. No size change was noticed upon this thermal treatment.

TABLE 1

UNSUPPORTED SQUARE FLATNESS & SIZE MATCH

| Exposure level mJ/cm² | Composition A | | Composition B | |
|---|---|---|---|---|
| | Flatness | Size Match | Flatness | Size Match |
| 4.38 | No image | | Yes | Too fragile to be measured |
| 10.34 | Yes | Yes | Yes | Yes |
| 20.59 | No | No | Yes | Yes |
| 30.85 | No | No | Yes | Yes |
| 41.10 | No | No | Yes | Yes |
| 52.28 | No | No | Yes | Yes |

EXAMPLE 2

The effect of exposure level on layer thickness for unsupported layers of Composition B of Example 1 was plotted in FIG. 4. Thickness limiting characteristics was obtained as shown by the leveling off of the curve in FIG. 4. This property is highly desirable since it provides a way to achieve controlled layer thickness with wider latitude.

EXAMPLE 3

A multilayer square was prepared as follows:

1. A ten mil (0.010 inch) liquid layer of composition B of example 1 was laid by means of a doctor knife on top of a flat solid substrate (6×6") attached to an elevator.

2. The liquid layer was scanned with a laser from the top in a square area of three inches by three inches. The exposure level was high enough to attain a thickness higher than 10 mils, so that the photoformed layer adhered to the temporary substrate.

3. The elevator was lowered by ten mils.

4. A new liquid layer having a thickness of 10 mils was laid on top of the previously imagewise exposed square in register.
5. The new liquid layer was scanned again with a laser from the top as in step 2.
6. Steps 1, 2, and 3 were repeated until a square having a thickness of 60 mils was obtained. The square was removed from the temporary substrate and blotted dry with paper towels. It was die-cut into six specimens of standard tensile strength pattern (ASTM D638-87 B). Three specimens were thermally coalesced in an oven at 180° C. for 15 minutes. They became translucent from opaque in appearance. The tensile strength properties were measured on an Instron Instrument using ASTM D638-87 B procedure. Significant improvement in tensile strength and elongation was obtained in the case of the thermally coalesced samples as compared to the untreated controls. This supports the fact that the fusion of the plastisol occurred upon thermal treatment. The treated specimens were very flexible and had about 200% elongation and excellent layer to layer adhesion.

EXAMPLE 4

A complex object with 2.44 inch thickness was made with composition B of Example 1. It had varying size and geometry for different layers with overhanging features, as well as joining surfaces, directly exposed surfaces, and infraposed surfaces. The basic method described in Example 3 was used except that the scanning patterns were different for different layers. The exposure used was 20 mj/cm$^2$. After the three dimensional object was made, it was removed from the substrate. The excess unexposed liquid was removed physically. It was then placed in an ultrasonic water bath to facilitate the removal of the residual unexposed liquid. Since water is a poor solvent, the time in the bath is not critical. The object was then wiped dry to remove the remaining water, and it was rinsed with isopropanol, which is a mild solvent, for about 30 seconds, just enough time to remove any residual unexposed liquid material. The resulting object was allowed to air dry in the room for about 30 minutes. Upon examination at this point it was found to have good integrity. To improve its physical properties, it was thermally coalesced at 180° C. for 15 minutes. An excellent three dimensional object was obtained.

EXAMPLE 5

Two unsupported squares (1.5"—1.5") of Composition B formed by scanning with a laser at exposure levels of 20 and 23 mJ/cm$^2$ as described in Example 1. They were then blotted dry with paper towels. One square was laid on top of the other with an overlapping area of one inch. Finger pressure was used to provide good contact between the two squares. These were thermally coalesced at 180° C. for 15 minutes, and they were allowed to cool to room temperature. Attempts to separate the two squares apart were unsuccessful, and finally cohesive breakage occurred rather than adhesive breakage. This showed clearly that excellent layer to layer adhesion can be achieved by photoformable compositions comprising plastisol after thermal coalescence. The thicknesses of the two squares were 19 and 20 mils, respectively. They became translucent from opaque upon thermal treatment. Since good adhesion can be achieved with even two separately prepared squares, one may safely conclude that in a multilayer structure only minimal exposure is adequate to just produce the layers and lightly attach them to each other through their joining surfaces, while final potent adhesion may be obtained through a later thermal coalescing step. Therefore, the lack of need to use excessive exposure in order to promote adhesion, prevents undesired overgrowth of infraposed surfaces, and gives rise to improved resolution and adherence to specified tolerances.

EXAMPLE 6

A pair of squares (1"×1") obtained from each composition (A and B) of Example 1 were blotted dry. The two squares (one exposed with 30.85 mj/cm and the other at 41.1 mJ/cm$^2$) corresponding to each pair were laid on top of each other, with a ⅜" overlap. They were put between two pieces of copper board with a 100 gram weight on top to ensure good contact between squares. After thermal treatment at 180° C. for 15 minutes, followed by room cooling, it was found that no adhesion was obtained in the case of the pair corresponding to composition A, while excellent adhesion was obtained in the case of the pair proceeding to composition B. This illustrates once more the superiority of the method of the instant invention.

EXAMPLE 7

A plastisol was made by mixing the following ingredients until a homogeneous mixture was received.

| | |
|---|---|
| Sanitizer 97 (C7 and C9 adipate from Monsanto) | 40 g |
| Geon 121 AR (Multi purpose PVC dispersion resin from Goodrich) | 100 |
| Paraplex G-62 (Epoxydized Soybean oil from C. P. Hall) | 5 |
| Mark 2109 (Organic barium and cadmium stabilizer from Argus Chem. Co) | 2 |
| To the above mixture, the following homogeneous mixture was added: | |
| Ethoxylated Trimethylol propane Triacrylate | 49 |
| Sartomer 9610 (Urethane diacrylate resin) | 49 |
| Irgacure 651 (2,2 dimethoxy-2-phenylacetophenone) | 3.92 |

The final photoformable composition described above was evaluated as shown in Examples 1-3 and found to exhibit similar properties.

EXAMPLES 8 AND 9

The same ingredients as in composition B of Example 1 were used with the difference that Chem-o-sol R 7557 was replaced by either Wilflex 3167 (by flexible Products Company) or 40D Clear PVC Plastisol (by Specialty Dispersion Company), and they were evaluated as described in Examples 1, 2 and 3. They gave similar results. Improved elongation and tensile strength was observed in final parts made from the above compositions. The parts made from Wilflex 3167 had somewhat higher photospeed as compared to the 40D Clear PVC, but comparable photospeed as compared to composition B of Example 1.

What is claimed is:

1. A method for accurately fabricating an integral three dimensional object from a multiplicity of contiguous layers of a thermally coalescible photoformable liquid composition comprising the steps of:
   (a) forming a layer of a thermally coalescible photoformable liquid on a substrate;

(b) imagewise exposing areas of at least a portion of the layer to actinic radiation;

(c) introducing a new layer of liquid onto the layer previously exposed imagewise to actinic radiation according to step (b);

(d) imagewise exposing areas of at least a portion of the new liquid layer to actinic radiation, with the requirement that the photoformable composition comprises a thermally coalescible polymeric cohesive material, a photohardenable monomer, and a photoinitiator, wherein after the exposure to the acthnic radiation, the photoformed areas of the composition remain thermally coalescible;

(e) successively repeating steps (c) and (d) until all layers of the three dimensional object have been photoformed and connected through joining surfaces; and (f) in sequence
  (i) removing the unexposed portion of the photoformable composition from the exposed portion of the three dimensional object, and
  (ii) thermally coalescing the three dimensional object in order to promote cohesion both within the contiguous layers and at the joining surfaces between the contiguous layers, thus producing a single coalesced three dimensional object.

2. A method as defined in claim 1, wherein at least one of the layers has also an infraposed surface.

3. A method as defined in claim 2, wherein the photohardenable monomer comprises an ethylenically unsaturated monomer.

4. A method as defined in claim 3, wherein the ethylenically unsaturated monomer is selected from the group consisting of unsaturated bisphenol A oligomers, unsaturated urethane oligomers, and mixtures thereof.

5. A method as defined in claim 2, wherein the removing step (f)(i) is performed with a poor non-coalescing solvent.

6. A method as defined in claim 2, wherein the actinic radiation comprises a laser beam.

7. A method as defined in claim 2, wherein the thermally coalescible material comprises a plastisol containing a polymer and a thermal plasticizer.

8. A method as defined in claim 7, wherein the polymer is selected from the group consisting of polyvinyl halide, polyvinyl halide acetate, polyvinylidene halide, polyvinylidene halide acetate, polyphenylene oxide, polyvinyl acetal, and mixtures thereof.

9. A method as defined in claim 8, wherein the halide is selected from the group consisting of chloride, fluoride, and mixtures thereof.

10. A method as defined in claim 9, wherein the ethylenically unsaturated monomer is selected from the group consisting of unsaturated bisphenol A oligomers, unsaturated urethane oligomers, and mixtures thereof.

11. A method as defined in claim 9, wherein the actinic radiation comprises a laser beam.

12. A method as defined in claim 7, wherein the thermal plasticizer is non-polymerizable.

13. A method as defined in claim 7, wherein the photoformable liquid composition further comprises reinforcement fibers.

14. A method as defined in claim 7, wherein the unsaturated monomer constitutes part of the polymer.

15. A method as defined in claim 14, wherein the photoinitiator constitutes part of the polymer.

16. A method as defined in claim 7, wherein the polymer is selected from the group consisting of acrylic polymers, methacrylic polymers, and mixtures thereof.

17. A method as defined in claim 1, further comprising the steps of: repeating the steps used in the method of claim 1 in order to fabricate at least one additional single integral three-dimensional object, each single object thus fabricated having at least one first preselected matching surface intended to match a second matching surface, the second surface being part of at least one other single object; applying a coating of thermally coalescible composition on at least one of the first and second matching surfaces; bringing the first matching surfaces in contact with the second matching surfaces; and thermally coalescing the coating of the thermally coalescible composition within the first and second matching surfaces in order to form a strong bond between the first and second surfaces, thus completing the fabrication of an integral complex object.

18. A method as defined in claim 1, further comprising the steps of: repeating the steps used in the method of claim 1, except step (f)(ii) in order to fabricate at least one uncoalesced single integral three dimensional object, each uncoalesced single object thus fabricated having at least one third matching surface intended to match a fourth matching surface, the fourth matching surface being part of at least one other single object; bringing the third matching surfaces in contact with the fourth matching surfaces; and thermally coalescing the uncoalesced single object in order to form a strong bond between the first and second surfaces, thus completing the fabrication of an integral complex object.

* * * * *